United States Patent [19]

Tancrell et al.

[11] 3,800,247

[45] Mar. 26, 1974

[54] SURFACE WAVE STRUCTURE

[75] Inventors: Roger H. Tancrell, Cambridge; Paul C. Meyer, Newton, both of Mass.

[73] Assignee: Raytheon Company, Lexington, Mass.

[22] Filed: June 23, 1971

[21] Appl. No.: 155,920

[52] U.S. Cl. .................. 333/30 R, 333/72
[51] Int. Cl. .................. H03h 7/30
[58] Field of Search .............. 333/30 R, 72; 310/8.1, 310/8.2, 8.3; 187/.5 R

[56] References Cited

UNITED STATES PATENTS

| | | | |
|---|---|---|---|
| 3,300,739 | 1/1967 | Mortley | 333/30 R |
| 3,376,572 | 4/1968 | Mayo | 333/72 |

*Primary Examiner*—Benjamin A. Borchelt
*Assistant Examiner*—J. V. Doramus
*Attorney, Agent, or Firm*—Joseph D. Pannone; Milton D. Bartlett; David M. Warren

[57] ABSTRACT

A surface wave electrode structure in which an apodized interdigital surface array is tilted with respect to the direction of propagation of the surface wave, for example, by having the individual digital fingers extend perpendicular to the direction of propagation but having the locus of their midpoints lie on a path at an angle to the direction of propagation.

25 Claims, 6 Drawing Figures

SURFACE WAVE STRUCTURE

REFERENCE TO RELATED APPLICATION

Application Ser. No. 82,250 filed Oct. 20, 1970 and now abandoned of Melvin G. Holland et al. and assigned to the same assignee as is the instant application is hereby incorporated herein by reference.

BACKGROUND OF THE INVENTION

This invention relates to acoustic surface wave devices and systems utilizing such devices, and more particularly to acoustic surface wave devices in which arrays of interdigital electrodes are disposed upon a surface of a high coupling substrate such as a piezoelectric substrate in comb-like arrays. Acoustic surface wave devices offer several advantages in the construction of delay lines and filters in the UHF range in such systems as radar using linear chirp waveforms, comb structures in broad band delay lines and in systems requiring frequency response to phase coded signals, linear FM signals, nonlinear FM signals and signals with special coding for use with matched filter type devices. In these and other devices, the frequency response is determined by the interdigital finger spacing and overlap of the interdigital comb structures used as input and output transducers.

The present invention describes an improved geometric shaping for interdigital transducers of the acoustic surface wave type in which a controlled frequency response is obtained by phasing the fingers and apodizing or varying the finger overlap to enable variable energy coupling between fingers. Additional control is obtained by tilting the finger arrays of the interdigital combs which overcomes the problem of multiple reflection encountered when high coupling piezoelectric material is used for the transducer medium. This tilted design allows an acoustic wave generated at one finger in the array to travel toward the receiver array without having to pass under a great number of other fingers of the array.

The use of apodized combs as acoustic surface wave filters is described in the proceedings of the IEEE, Vol. 59, No. 3, Mar. 1971 in an article by R.H. Tancrell and M.G. Holland titled *Acoustic Surface Wave Filters*. In interdigital comb structures of the prior art the individual digital finger electrodes are all the same length and are plated, evaporated or sputtered using standard photolithographic techniques on a piezoelectric surface. Electric waveforms applied to the teeth or fingers of the comb cause the piezoelectric material to distort and each finger radiates an acoustic plane wave along the piezoelectric substrate surface perpendicular to the finger edges with the output being the sum of all these transmitted waves as they pass under each finger.

The use of high coupling piezoelectric materials is desirable because it allows large bandwidth with minimum insertion loss; however, this high coupling causes an acoustic wave to be multiply reflected as it travels under the interdigital array. These reflections can destroy the amplitude and phase coherence of the surface wave necessary to achieve the desired electrical response from the surface wave device. In accordance with the principles of the present invention, these reflections can be greatly reduced by tilting the interdigital array, for example, with respect to the direction of propagation of the surface wave path in an array in which the interdigital electrodes have their individual fingers extend perpendicular to the direction of propagation but have the locus of their midpoints lying in a path at an angle to the direction of propagation of the electro-acoustic wave. With such a titled configuration, the surface wave generated by a finger can be launched from the transducer without being perturbed by other fingers of the array with resultant undesirable frequency distortion.

An example of a prior art electroacoustic wave shaping device is illustrated by Pat. No. 3,376,572 of R.F. Mayo in which a broadband nondispersive electroacoustic device using two identical chirped comb electrode arrays is illustrated. This prior art device does not provide for controlling the time impulse response or frequency response of the interdigital structure, for example, the described chirped combs produce an output having many sidelobes although it is desirable to have the output resemble the input as closely as possible. In terms of frequency, the frequency response of this device will be broadband but will have ripples in the bandpass such as Fresnel ripples. Additionally, it is also desirable to obtain control of the roll-off characteristic and ripple in the bandwidth produced rather than producing merely a broadband response. This control is achieved in the present invention by phasing the fingers properly, by apodizing the overlap and by tilting the array such that acoustic waves launched by any particular digital fingers pass under only a desired and variable number of other interdigital fingers.

SUMMARY OF THE INVENTION

An acoustic surface wave device is described in which a preferred geometric shaping for the interdigital electrodes disposed upon the surface of a distortable substrate such as piezoelectric material or other material capable of supporting a surface acoustic wave results in improved frequency response, improved efficiency and noise reduction in devices generally of the character which utilize acoustic surface waves. The disposition of the electrodes upon the underlying substrate may be by conventional methods such as by plating. Radar systems using linear chirp waveforms in which a linearly dispersive delay line is required, broadband delay lines, for example, in correlation systems, waveform generators which generate waveforms such as phase coded linear FM, nonlinear FM, signals with special coding and multiplexed signals, are examples of systems which may effectively utilize the present invention.

In accordance with the present invention, the above results are obtained by apodizing or varying the length and amount of overlap of the overlapping interdigital fingers of an electrode comb array such that the generated acoustic wave travels under only selected lengths of the parallel interdigital fingers, the overlap of which is determined in accordance with the waveform to be generated and/or received. Additionally, the transmitting and receiving acoustic comb electrodes are preferably tilted or axially displaced with respect to the underlying piezoelectric substrate upon which they are disposed such that an acoustic wave generated at one interdigital finger of the transmitting array is able to travel toward the receiver array without having to pass under a great number of other fingers in the array either the transmitter array or the receiver array, thereby minimizing multiple reflections. The axial displacement is such that the individual interdigital fingers extend perpendicular to the direction of wave propagation with the locus of the midpoints of the individual interdigital fingers lying at an angle to the direction of propagation and to an axis taken along the length of the electrode comb structure as a whole.

DESCRIPTION OF THE PREFERRED EMBODIMENTS

Figure 1:
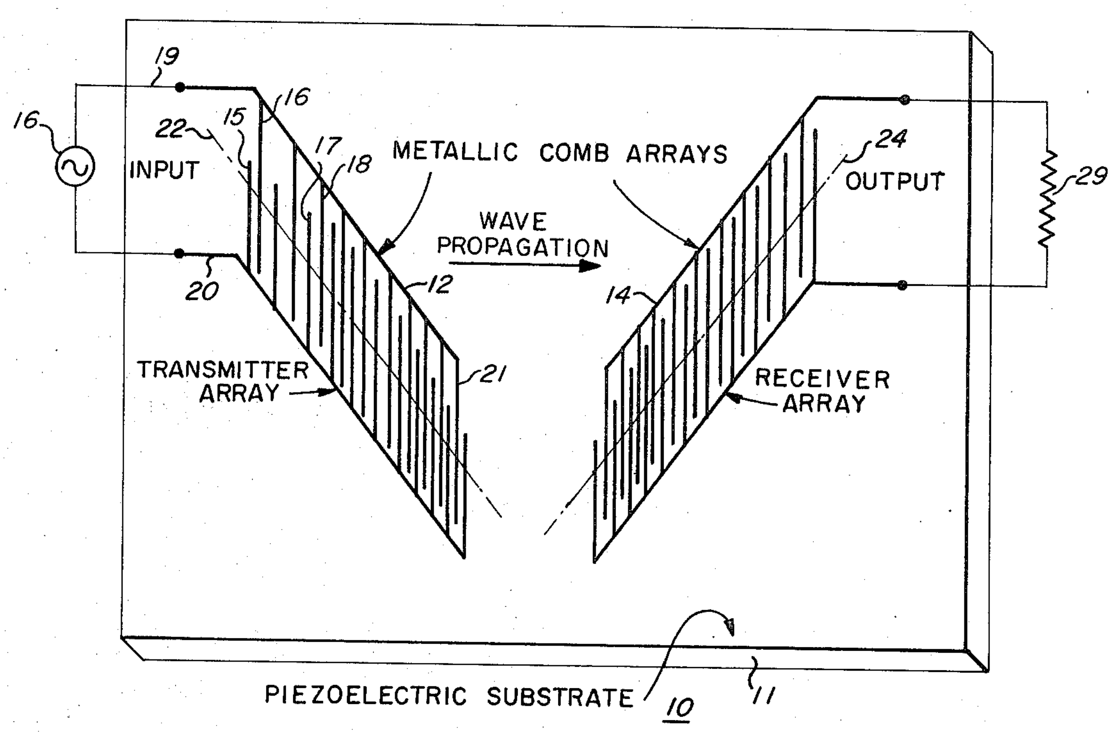
FIG. 1 illustrates a dispersive electroacoustic interdigital transducer comb array in accordance with the present invention.

Referring now to FIG. 1, an electroacoustic wave shaping device is illustrated generally at 10 in which a piezoelectric or other high coupling material 11 suitable for the transmission of electroacoustic waves on a surface thereof has deposited thereon input electrode means 12 comprising a plurality of metallic interdigital electrodes arranged in a comb-like array in a predetermined spacial and geometric relationship and an output or receiver array similarly arranged in a predetermined spacial and geometric relationship, which output array comprises a plurality of metallic and conductive interdigital fingers in a comb structure 14. The individual electrode fingers, such as 15, 16, 17 and 18 are parallel with each other and spaced apart distances which are a function of the frequencies to which the individual fingers are responsive, in accordance with well known techniques.

The use of high coupling material such as piezoelectric materials is desirable because it allows a large bandwidth with minimum insertion loss. However, this high coupling causes an acoustic wave to be multiply reflected as it travels under an interdigital array such as 12 or 14. These reflections can destroy the amplitude and phase coherence of a launched surface wave necessary to achieve the desired electrical response from the surface wave device. Such a surface wave is launched, for example, by electrical generator 16 which is connected to electrodes 19 and 20 of the transmitter array comb structure 12. The resultant electric field between the digital elements or fingers results in the generation and propagation of a wave along the surface of a piezoelectric substrate 11 in the direction indicated by the arrow in FIG. 1, which wave is shaped in accordance with the spacing between adjacent electrodes, the overlapping of electrodes and the axial angle or tilt of the interdigital electrodes with respect to their central axis, the latter two of which criteria are set forth by the instant invention.

Figure 2:
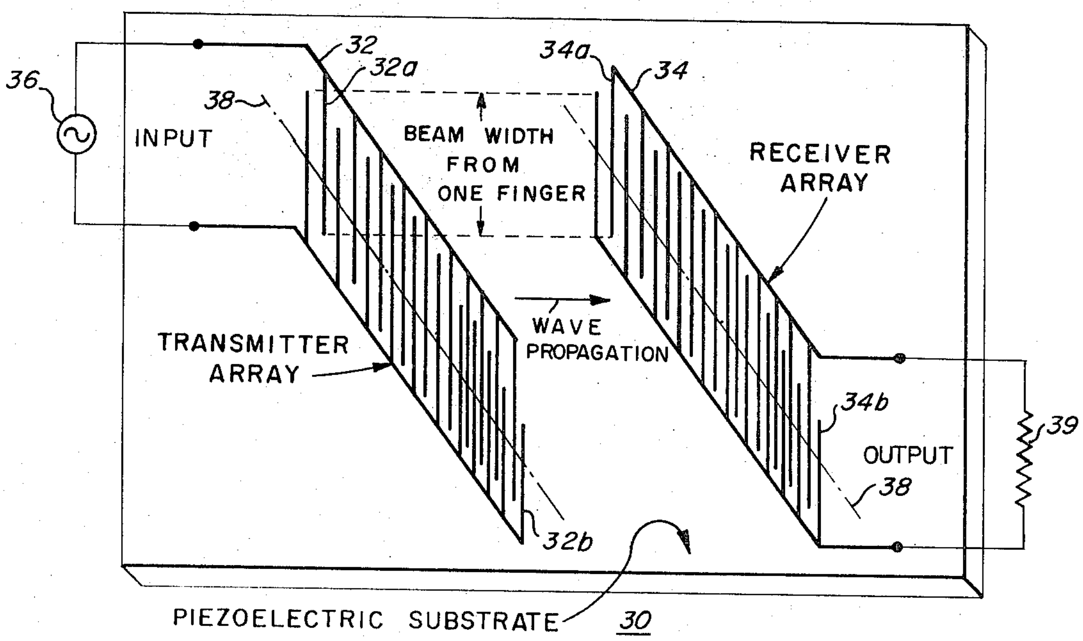
FIG. 2 illustrates a nondispersive electroacoustic interdigital comb array in accordance with the present invention.

For the transmitter array 12, the central axis is shown as 22 and for the receiver array, the central axis is shown as 24, both of which axis are at an angle to the direction of propagation. Multiple reflections can be greatly reduced by using a tilted array in accordance with the instant invention which enables the surface wave generated by any particular interdigital finger to be launched from the transducer without being perturbed by the other fingers of the array. For example, a wave launched from the overlapped region between electrodes 15 and 16 travels perpendicular to those electrodes and will not be distorted by passing beneath electrode 21. In contradistinction, the wave launched from an untilted array would propagate along axis 22 and would be perturbed by all of the electrodes in the comb array. For a large array, this perturbation is large, and in accordance with the present invention is reduced in accordance with the degree of axial tilt of the comb array. This is because the acoustic beam is launched perpendicular to the fingers with the beam width equal to the overlap of the finger with the adjacent finger as is illustrated by FIGS. 1 and 2. This launched surface wave is received by the overlapped portion of the receiver array which intercepts this beam; for example, a beam launched by finger **32*a* of the transmitter array of FIG. 2 is received by finger 34*a*** of the receiver array.

The design of FIG. 1 is particularly adaptable to chirped arrays wherein the interdigital finger spacing is gradually changed from one end of the array to the other thereby resulting in a broadband frequency response. Each section of the array is resonant at a different frequency, hence only a particular section of one array "speaks" to the similar section in the other array. The fingers which are not active at a particular frequency are removed or moved away by the tilting of the arrays with respect to their central axes so that the generated acoustic wave does not have to travel under them to reach the resonant fingers in the receiver array, thus the operation of the tilted structure illustrated by FIG. 1 is an improvement over the untilted array with the additional advantage that the effect of multiple reflection is substantially eliminated, hence resulting in a far more frequency responsive structure. The geometric configuration shown by FIG. 1 is a dispersive array in that in a generated surface wave, the various frequency components travel different distances between the arrays thus the position along the combs where a particular frequency is generated is easily controllable since the comb is most efficient in generating acoustic waves where the interdigital spacing is one-half wave length.

Further improved frequency response of the comb structures is obtained by apodizing or varying the amount of overlap between adjacent interdigital fingers of the comb. This technique which is described in the aforementioned patent application of M. Holland, assigned to Raytheon, and also in the aforementioned IEEE article of R.H. Tancrell et al. and which discloses that the transmitted energy is proportional to the amount of overlap of the particular interdigital fingers results in even better frequency response. Reflection distortion resulting from the acoustic wave passing under unnecessary electrodes results when the apodized combs are tilted in accordance with the present invention.

Referring now to FIG. 2, a nondispersive electroacoustic geometric array is illustrated generally at 30. In contradistinction with comb structures 12 and 14 of FIG. 1, comb structures 32 and 34 of FIG. 2, comb structure 32 being the transmitting array and comb structure 34 being the receiver array are spaced such that the distance from any electrode on the transmitter array which is in resonance with any other electrode on the receiver array are all equally spaced, thus, the same time is required for propagation of the electroacoustic wave, for example from electrode 32*a* to electrode 34*a* as is required for propagation of the higher frequency wave from electrode 32*b* to electrode 34*b*. Put another way, the time delay versus frequency characteristic of the nondispersive system illustrated by FIG. 2 is a constant while that of FIG. 1 is sloped either linearly or by any desired function.

Combined with the tilting, the overlap between the interdigital fingers may be varied to achieve a particular frequency response for the device, thus, any waveform which may be generated by electrical generator 36 may be coupled between the transmitting array 32 and receiving array 34 with minimum distortion as the amount of energy radiated by each finger is controllable as is the particular frequency at which the interdigital fingers respond to the generated wave form with higher frequencies being generated by fingers more closely spaced and lower frequencies being generated by fingers further apart. The tilting technique is superior to techniques in which several different staggered arrays are connected in parallel in that it eliminates the discontinuities associated with the end of one array and the beginning of the next array. Additionally, this design technique allows many fingers to be used on high coupling material thus achieving low insertion loss and large bandwidth simultaneously, all of which advantages are important in all surface wave devices such as delay line filters and in radar signal processers as will be explained. The tilting of the electrodes shown in FIG. 2 is illustrated with respect to the central array comb axis 38 in the same manner as is the tilting of the arrays of FIG. 1 with respect to the axes 22 and 24. Of course other angular relationships then those illustrated may be utilized, depending only upon the particular waveforms which is desired to couple or reproduce. The receiver arrays 14 and 34 of FIGS. 1 and 2 respectively are shown terminated by resistive loads 29 and 39 respectively for illustrative purposes only, and utilization devices and systems such as those of FIGS. 3 through 6 may of course be alternatively employed.

Figure 3:
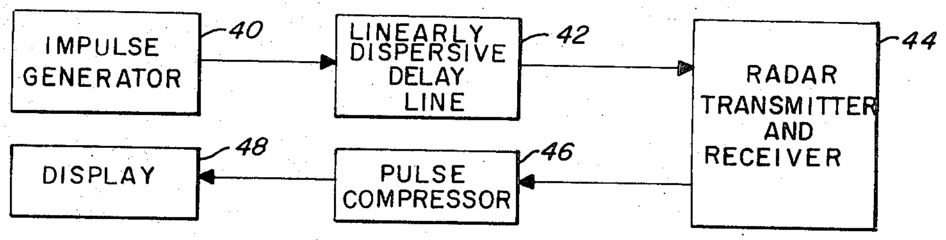
FIG. 3 is a block diagram of a radar system which employs electroacoustic surface wave devices having an electrode configuration of the present invention.

Referring now to FIG. 3, a general block diagram of a linear chirp radar system which may utilize a linearly dispersive delay line constructed in accordance with FIG. 1 is shown. An impulse generator 40 generates an energy pulse which excites linearly dispersive delay line 42 which disperses this energy pulse to produce, for example a linearly frequency chirped waveform suitable for pulse compression techniques. This waveform is then transmitted by a conventional pulse compression type radar transmitter-receiver unit 44 and the return signal is compressed in a pulse compression circuit 46 comprising an array in accordance with that of FIG. 1 for display on the radar screen 48. An improved signal results as the linearly dispersive delay line 42 is able to produce the desired signal more exactly thereby enabling pulse compressor 46 to act only on those frequencies which fall within a desired bandwidth and eliminates those extraneous frequencies by the improved reproduction of the original signal by linearly dispersive delay line 42.

Figure 4:
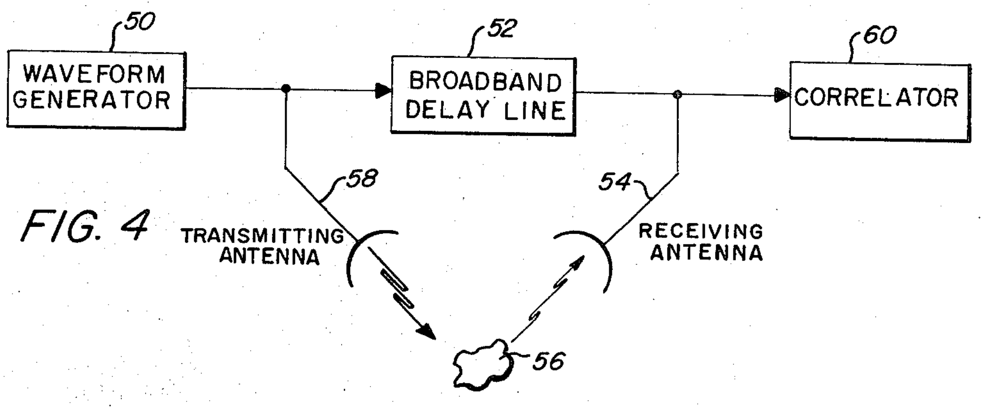
FIG. 4 is a block diagram of a broadband delay line using tilted comb arrays of the present invention.

Referring now to FIG. 4, a general block diagram illustrating the use of tilted combs of the present invention for a broad band delay line is shown. In correlation type radar systems using either auto-correlation or cross-correlation techniques, a transmitted signal is formed by waveform generator 50 which signal may be delayed by a broadband delay line 52 and combined with the reflected signal received via antenna 54 from a target or cluster of targets 56 resulting from the transmission of the generated waveform via transmitting antenna 58. The received target echo is correlated at a correlator 60 in the radar receiver with an original delayed replica of the signal generated by waveform 50 which delayed replica is generated in the broadband delay line 52 thereby resulting in cross-correlation of the received signal with the delayed signal at correlator 60. When the tilted or the tilted and apodized comb arrays of the present invention are utilized as the broadband delay line 52 an improved phase response results with minimum frequency distortion.

Figure 5:
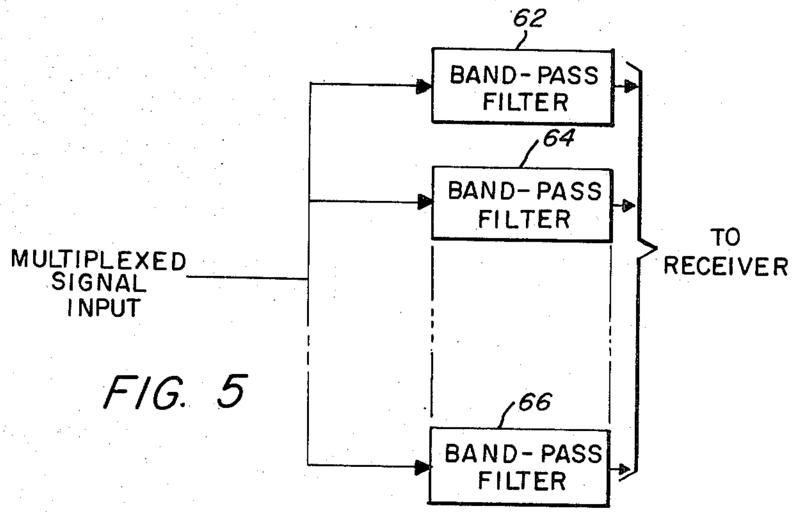
FIG. 5 is a block diagram of a bandpass filter for the reception of multiplexed signals using surface wave devices in accordance with the present invention.

Another application of the tilted or tilted and apodized comb structures of the present invention is illustrated by FIG. 5 in which these devices are utilized as a series of bandpass filters for use in systems in general requiring filtering of multiplexed input signals into a plurality of output signals with minimum interaction between the various frequency signals resulting from reflections in the acoustic surface wave device. By employing the structure of, for example FIG. 2 of the present invention, as bandpass filters 62, 64 and 66 an improved filtering system is obtained.

Figure 6:
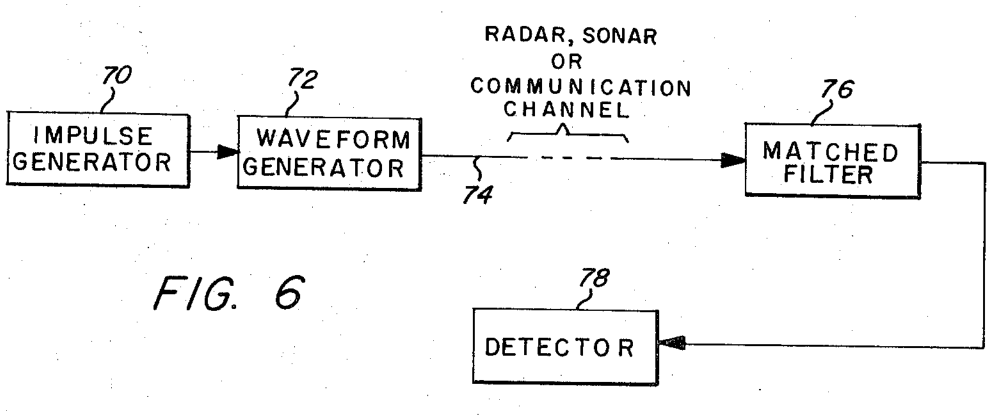
FIG. 6 is a general block diagram of a matched filter system utilizing tilted comb surface wave devices of the present invention for both transmission and reception of various waveforms.

Referring now to FIG. 6 a general block diagram of a system for the generation and detection of waveforms such as phase coded signals, linear FM signals, nonlinear FM signals, or signals with special coding is illustrated in which signals generated by an impulse generator 70 of conventional design are coupled to tilted comb structures, either with or without apodizing in accordance with the present invention which form a waveform generator 72 and which generates said phase coded signals, FM signals, nonlinear FM signals or signals with special coding depending only upon the comb design parameters, i.e., amount of tilt, degree of apodization and separation of the interdigital fingers. The output of waveform generator 72 is coupled through either a radar, sonar or communication channel in general 74 to a matched filter, which matched filter comprises a tilted comb surface wave device designed to match whatever waveform is generated by waveform generator 72 at the matched filter 76, the output of which may be detected by a conventional detector 78.

While in the preferred embodiment, the high coupling material has been disclosed as piezoelectric material, in general it is to be understood that crystals have a surface wave piezoelectric surface wave coupling coefficient and a surface wave temperature coefficient of delay time which varies with temperature and/or the direction of propagation and surface waves may be propagated in directions other than along the X-axis of Y-cut crystal. Variation of the electrical characteristics of a surface vibratory wave system with fluctuations in temperature may be reduced for the operating temperature of the system to less than 25 parts per million. For example, surface waves may be piezoelectrically coupled to quartz crystals sliced in a plane whose normal is at some angle to the Z-axis in which is contained the X-axis which may be considered as a rotated Y-cut crystal. A useful range of operation lies in the region between 0° and 90° of rotation for operating temperatures between 0° and 100°C, as is described in the aforementioned patent application of Melvin Holland assigned to the same assignee as is the present application.

It is to be understood that the details set forth herein are illustrative of the novel features that characterize the invention, and that various changes and modifications are possible within the scope of the appended claims. For example, various combinations of interdigital spacing, finger apodization and angle of tilt are possible dependent only upon the particular waveforms desired to reproduce. Additionally, various types of substrates and electrodes and methods of deposition of the electrodes on the various substrates are possible, any of which may be adapted to utilize the teaching of the present invention and accordingly this invention is intended to be limited only as defined by the appended claims.

What is claimed is:

1. A surface wave device comprising:

a substrate capable of supporting waves travelling on a surface of said substrate;

electrode means disposed on said surface of said substrate, said electrode means including an input electrode portion and an output electrode portion for launching a surface wave on said substrate, the longitudinal axes of said electrodes being tilted with respect to the path of said surface waves.

2. A surface wave device in accordance with claim 1 wherein said input and output electrode means are interdigital electrode comb arrays, each of which comprise a plurality of digital portions spaced one from the other in accordance with a desired frequency response.

3. A surface wave device in accordance with claim 2 wherein the individual digital portions of said electrode array extend perpendicular to the direction of said transmitted surface wave and wherein the locus of the midpoints of said individual digital portions of said electrodes lie in a path at a angle to said transmitted surface wave.

4. A surface wave device in accordance with claim 3 wherein said substrate comprises a piezoelectric material.

5. A surface wave electrode structure comprising:

a piezoelectric substrate capable of supporting waves travelling on the surface of said substrate;

an interdigital electrode array disposed upon the surface of said piezoelectric substrate for launching an wave thereon; and the longitudinal axis of said electrode structure being tilted with respect to the direction of the surface wave path.

6. The surface wave electrode structure in accordance with claim 5 wherein said electrode array comprises an input interdigital comb array and an output interdigital comb array, both of which input and output comb arrays include a plurality of individual fingers extending perpendicular to the direction of propagation of said surface waves with the longitudinal axis of said electrode array lying at an angle to the path of said surface wave.

7. A surface wave electrode structure in accordance with claim 6 wherein said angle is an acute angle.

8. A surface wave device comprising a piezoelectric substrate having a surface capable of supporting waves travelling thereon;

electrode means located on said substrate surface comprising respective input and output portions each of which includes a plurality of digital fingers, said digital fingers of said input and output electrode portions arranged substantially parallel to each other in spaced interdigital relationship with the spacing distances between each successive adjacent pair of interdigital fingers being arbitrarily selected with some of said interdigital fingers being more closely adjacent than other of said interdigital fingers;

the improvement comprising geometrically configuring said electrode arrays such that the individual fingers extend perpendicular to the direction of said surface wave path and the locus of the midpoints of said individual fingers are at an angle to the direction of propagation of said surface wave.

9. A surface wave device in accordance with claim 8 wherein the amount of overlap between the individual interdigital fingers varies in accordance with a geometric pattern determined by the waveform of the signal applied to said electrode means.

10. A surface wave acoustic device in accordance with claim 8 wherein said first and second electrode portions are apodized.

11. A surface wave structure comprising:

a piezoelectric substrate for supporting wave propagation;

electrode means disposed on a surface of said substrate for receiving electrical inputs, said electrode means including first and second interdigital comb arrays each of which includes a plurality of parallel electrodes spaced in interdigital relationship in accordance with a predetermined geometric pattern, some of said individual electrodes being spaced further apart than other of said electrodes;

means for applying a generated waveform to said electrode means;

said interdigital electrode combs being apodized for obtaining a frequency response corresponding to said generated waveform and wherein the individual electrodes of said interdigital comb array extend perpendicular to the direction of propagation of said wave and the locus of the midpoints of said plurality of parallel electrodes of said comb arrays extend in a path at an angle to the direction of propagation of said wave.

12. A surface wave electrode structure comprised of an interdigital array of interspaced electrodes disposed on the surface of a piezoelectric substrate for launching a wave on said surface, wherein the individual electrodes of said array extend perpendicular to the direction of propagation of said surface wave and the locus of the midpoints of said individual electrodes lie at an angle to said direction of propagation.

13. An electrode structure in accordance with claim 12 wherein said array configuration is nondispersive.

14. An electrode configuration in accordance with claim 12 wherein said array configuration is dispersive.

15. A surface wave electrode structure in accordance with claim 12 wherein said surface wave electrode structure comprises first and second electrodes each having a plurality of digital portions, said digital portions of said first and second electrodes being arranged substantially parallel to each other in spaced interdigital relationship.

16. A surface wave electrode structure in accordance with claim 15 wherein said spaced interdigital relationship corresponds to a predetermined desired frequency response.

17. A surface wave electrode structure in accordance with claim 15 wherein the individual electrodes of said electrode arrays are apodized in accordance with a predetermined desired frequency response.

18. In combination:

means for generating a predetermined waveform including a surface wave device comprised of at least an interdigital electrode array disposed on the surface of a piezoelectric substrate for launching a surface wave on said substrate perpendicular to said individual electrodes of said electrode array and at an angle to the locus formed by the midpoints of said individual electrodes; and a matched filter coupled to said waveform generating means comprised of an electrode array on a piezoelectric substrate, said electrode array being tilted to match said generated waveform.

19. A combination in accordance with claim 18 wherein said generated waveform in a phase coded signal.

20. A combination in accordance with claim 18 wherein said waveform is a linear FM signal.

21. A combination in accordance with claim 18 wherein said generated waveform is a nonlinear FM signal.

22. A bandpass filter comprising:

a substrate capable of supporting waves travelling on a surface of said substrate;

a plurality of electrode means disposed on said surface of said substrate, each electrode means including an input electrode portion and an output electrode portion for respectively launching and receiving a surface wave on said substrate;

said input and output electrode portions comprised of a plurality of interspaced electrodes in a comb array, the axis of said array being at an angle with respect to the direction of propagation of said wave.

23. In combination:

a solid body for supporting waves propagated on a surface thereof; and elongated transducer means coupled to said body for introducing and extracting said waves into and out of said body comprising an elongated transducer with the average direction of said elongation positioned at an angle with respect to the average direction of propagation of said waves.

24. The combination of claim 23 wherein the frequency of waves which are introduced and extracted from said substrate is varied along the length of said elongated transducer.

25. In combination:

a solid body for supporting waves propagated on a surface thereof; and means located on said surface for inducing and receiving said waves, waves of different frequencies being separated from one another on said surface.

* * * * *